(12) United States Patent
Sakai et al.

(10) Patent No.: US 12,707,560 B2
(45) Date of Patent: Aug. 11, 2026

(54) WIRING SUBSTRATE AND METHOD FOR MANUFACTURING THE SAME

(71) Applicant: IBIDEN CO., LTD., Ogaki (JP)

(72) Inventors: Shunsuke Sakai, Ogaki (JP); Koji Okabe, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 176 days.

(21) Appl. No.: 18/542,813

(22) Filed: Dec. 18, 2023

(65) Prior Publication Data

US 2024/0206057 A1 Jun. 20, 2024

(30) Foreign Application Priority Data

Dec. 16, 2022 (JP) ................................ 2022-201214

(51) Int. Cl.
*H05K 1/02* (2006.01)
*H05K 3/06* (2006.01)

(52) U.S. Cl.
CPC .......... *H05K 1/0296* (2013.01); *H05K 3/067* (2013.01); *H05K 3/064* (2013.01)

(58) Field of Classification Search
CPC ...... H05K 1/0296; H05K 3/067; H05K 3/064; H05K 3/06; H05K 2201/098; H05K 1/09; H05K 3/022; H05K 3/068; H01L 24/16
USPC ........................................................ 174/257
See application file for complete search history.

(56) References Cited

U.S. PATENT DOCUMENTS

2013/0221521 A1* 8/2013 Yang ...................... H01L 24/81 257/737
2017/0372991 A1* 12/2017 Tsukamoto ....... H01L 23/49827
2020/0258800 A1* 8/2020 Ecton ................ H01L 23/49822

FOREIGN PATENT DOCUMENTS

JP H07-273465 A 10/1995

* cited by examiner

*Primary Examiner* — Timothy J Thompson
*Assistant Examiner* — Sidi M Maiga
(74) *Attorney, Agent, or Firm* — Finnegan, Henderson, Farabow, Garrett & Dunner, LLP

(57) ABSTRACT

A wiring substrate includes a substrate, and a conductor layer formed on the substrate and including copper such that the conductor layer is patterned. The conductor layer is formed such that the upper surface of the conductor layer has a width that is equal to or larger than a width of the lower surface of the conductor layer and that the width of the lower surface is larger than the minimum width of a middle portion of the conductor layer between the upper surface and the lower surface.

16 Claims, 3 Drawing Sheets

WIRING SUBSTRATE AND METHOD FOR MANUFACTURING THE SAME

CROSS-REFERENCE TO RELATED APPLICATIONS

The present application is based upon and claims the benefit of priority to Japanese Patent Application No. 2022-201214, filed Dec. 16, 2022, the entire contents of which are incorporated herein by reference.

BACKGROUND OF THE INVENTION

Field of the Invention

The present invention relates to a wiring substrate and a method for manufacturing the wiring substrate.

Description of Background Art

Japanese Patent Application Laid-Open Publication No. H07-273465 describes a technology for forming a wiring formed of a patterned conductor layer using a subtractive method using an etching solution containing copper chloride. The entire contents of this publication are incorporated herein by reference.

SUMMARY OF THE INVENTION

According to one aspect of the present invention, a wiring substrate includes a substrate, and a conductor layer formed on the substrate and including copper such that the conductor layer is patterned. The conductor layer is formed such that the upper surface of the conductor layer has a width that is equal to or larger than a width of the lower surface of the conductor layer and that the width of the lower surface is larger than the minimum width of a middle portion of the conductor layer between the upper surface and the lower surface.

According to another aspect of the present invention, a method for manufacturing a wiring substrate includes forming a copper plating film on the entire surface of a substrate, forming a dry film resist layer on the copper plating film such that the dry film resist layer has a wiring pattern, forming a conductor layer on the substrate such that the upper surface of the conductor layer has a width that is equal to or larger than a width of the lower surface of the conductor layer and that the width of the lower surface is larger than the minimum width of a middle portion of the conductor layer between the upper surface and the lower surface, and removing the dry film resist layer from the conductor layer formed on the substrate. The forming of the conductor layer includes etching the copper plating film formed on the substrate such that part of the copper plating film is removed and that the conductor layer including copper and having the wiring pattern is formed on the substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
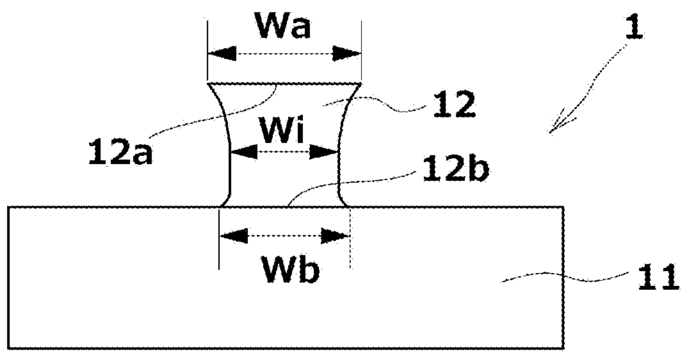
FIG. 1 is a cross-sectional view schematically illustrating a wiring substrate according to an embodiment of the present invention.

Embodiments will now be described with reference to the accompanying drawings, wherein like reference numerals designate corresponding or identical elements throughout the various drawings.

Wiring Substrate

Figure 2:
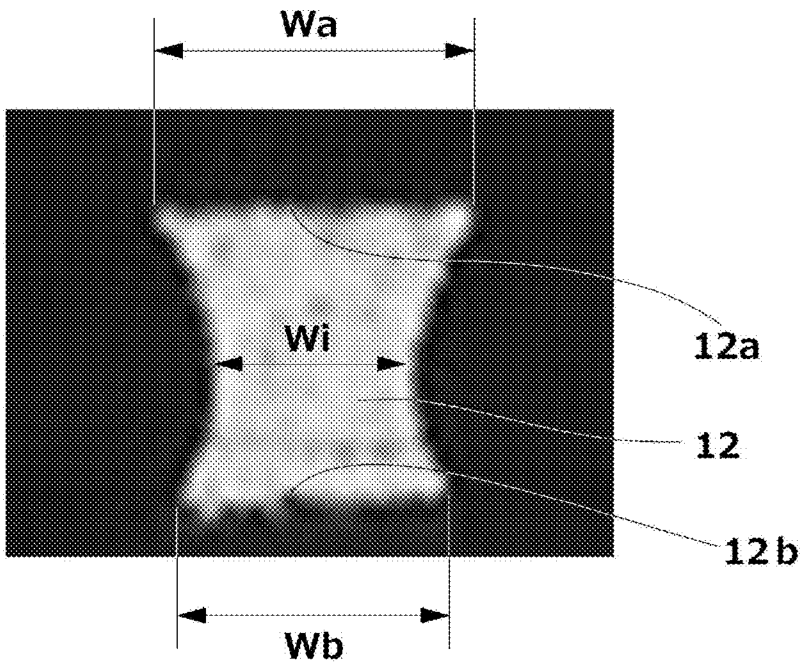
FIG. 2 is a cross-sectional photograph showing a wiring substrate according to an embodiment of the present invention.

In an example illustrated in FIGS. 1-3, dimensions of members, especially dimensions in a height direction, are described with dimensions different from actual dimensions so as to facilitate better understanding of the features of the present invention.

FIG. 1 is a cross-sectional view schematically illustrating a wiring substrate according to an embodiment of the present invention. Further, FIG. 2 is a cross-sectional photograph showing a wiring substrate according to an embodiment of the present invention. In FIGS. 1 and 2, the wiring substrate 1 includes at least a structure that includes a substrate 11 and a conductor layer 12, which is formed of copper and is patterned and formed on the substrate 11. In a shape of the conductor layer 12, a width (Wa) of an upper surface (12*a*) is larger than a width (Wb) of a lower surface (12*b*), and the width (Wb) of the lower surface (12*b*) is larger than the minimum width (Wi) of a middle portion.

In the wiring substrate 1 according to an embodiment of the present invention, the conductor layer 12 is formed to have a shape with the width (Wa) of the upper surface (12*a*) being equal to or larger than the width (Wb) of the lower surface (12*b*), and the width (Wb) of the lower surface (12*b*) being larger than the minimum width (Wi) of the middle portion. An inter-wiring distance between adjacent conductor layers 12 is determined based on widths of upper surfaces (12*a*) such that the upper surfaces (12*a*) are not in contact with each other. Therefore, the inter-wiring distance defined by the widths (Wa) of the upper surfaces (12*a*) can be reduced. As a result, a high density of wiring patterns formed of the conductor layers 12 can be achieved.

(The width (Wa) of the upper surface (12*a*))/(the width (Wb) of the lower surface (12*b*)) is preferably larger than 1 and smaller than 1.15. Further, (the width (Wa) of the upper surface (12*a*))/(the minimum width (Wi) of the middle portion) is larger than 1.15 and smaller than 1.75. When these ratios are in the above ranges, a high density of the wiring patterns formed of the conductor layers 12 can be achieved.

In a wiring substrate according to an embodiment of the present invention, the conductor layer 12 is preferably formed by etching with a copper chloride etching solution containing an etching inhibitor. When a conductor layer is formed by etching a copper plating film with a copper chloride etching solution, a width of an upper surface of the conductor layer may be smaller than a width of a lower surface of the conductor layer. By using a copper chloride etching solution containing an etching inhibitor, on a side surface of the conductor layer 12, an etching rate of an upper portion of the conductor layer 12 can be controlled to be lower than that of a lower portion, and the conductor layer 12 can be formed with the width (Wa) of the upper surface (12*a*) being larger than the width (Wb) of the lower surface (12*b*), and the width (Wb) of the lower surface (12*b*) being larger than the minimum width (Wi) of the middle portion.

Method for Manufacturing Wiring Substrate

FIGS. 3A-3D are each a cross-sectional view schematically illustrating processes of a method for manufacturing a wiring substrate according to an embodiment of the present invention. In the following, with reference to FIGS. 3A-3D, processes of a method for manufacturing a wiring substrate according to an embodiment of the present invention are described.

Figure 3A:
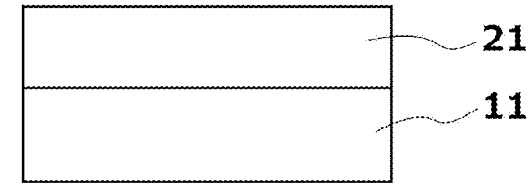
FIGS. 3A-3D are each a cross-sectional view schematically illustrating processes of a method for manufacturing a wiring substrate according to an embodiment of the present invention.

First, as illustrated in FIG. 3A, the substrate 11 is prepared, a copper plating film 21 is formed on an entire surface of the substrate 11, and an intermediate is prepared. The substrate 11 can be a core substrate or an insulating layer. Further, a seed layer can be formed between the substrate 11 and the copper plating film 21 by electroless copper plating.

Figure 3B:
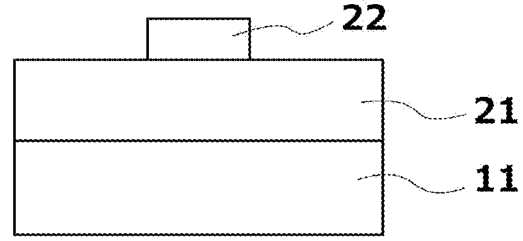

Next, as illustrated in FIG. 3B, a dry film resist layer 22 corresponding to a wiring pattern is formed on the copper plating film 21. The dry film resist (DFR), as conventionally known, is a film-like etching resist used for circuit formation. For example, a dry film resist is manufactured by drying a photoresist layer coated on a base film and then laminating a protective film onto the photoresist layer.

Figure 3C:
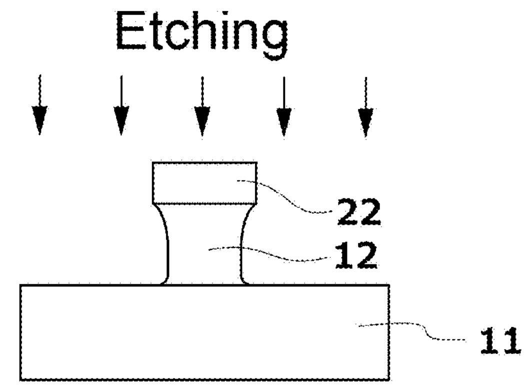

Next, as illustrated in FIG. 3C, a portion of the copper plating film 21 where the dry film resist layer 22 is not present is removed by etching, and, as illustrated in FIG. 1, the conductor layer 12 is formed with the width (Wa) of the upper surface (12*a*) being equal to or larger than the width (Wb) of the lower surface (12*b*), and the width (Wb) of the lower surface (12*b*) being larger than the minimum width (Wi) of the middle portion. As an etching solution used for the etching, as long as the conductor layer 12 can be formed with the width (Wa) of the upper surface (12*a*) being larger than the width (Wb) of the lower surface (12*b*), and the width (Wb) of the lower surface (12*b*) being larger than the minimum width (Wi) of the middle portion, any etching solution can be used.

In a method for manufacturing a wiring substrate according to an embodiment of the present invention, as an etching solution used for the etching, a copper chloride etching solution containing an etching inhibitor is preferably used. By using a copper chloride etching solution containing an etching inhibitor, since the inhibitor stays under the dry film resist layer where liquid flow is poor, etching of an upper portion of the conductor layer 12 is inhibited, and a lower portion of the conductor layer 12 is more easily etched. On a side surface of the conductor layer 12, an etching rate of the upper portion of the conductor layer 12 can be controlled to be lower than that of the lower portion, and the conductor layer 12 can be formed with the width (Wa) of the upper surface (12*a*) being larger than the width (Wb) of the lower surface (12*b*), and the width (Wb) of the lower surface (12*b*) being larger than the minimum width (Wi) of the middle portion.

Figure 3D:
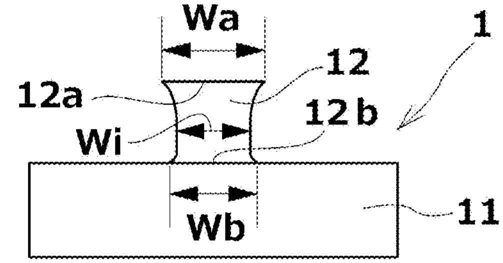

Next, as illustrated in FIG. 3D, the dry film resist layer 22 is removed from the conductor layer 12. As a method for the removal, a known method may be used. By removing the dry film resist layer 22, the wiring substrate 1 according to an embodiment of the present invention can be formed.

According to the method for manufacturing a wiring substrate described above, the conductor layer 12 can be formed to have a shape with the width (Wa) of the upper surface (12*a*) thereof being larger than the width (Wb) of the lower surface (12*b*) thereof, and the width (Wb) of the lower surface (12*b*) being larger than the minimum width (Wi) of the middle portion.

Figure 4:
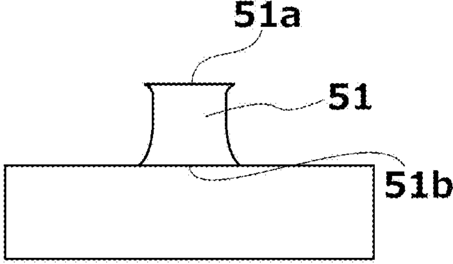
FIG. 4 is a cross-sectional view schematically illustrating an example of a conventional wiring substrate.

According to Japanese Patent Application Laid-Open Publication No. H07-273465, insulation between wirings can be ensured. On the other hand, a conductor layer as a wiring formed with the technology described in Japanese Patent Application Laid-Open Publication No. H07-273465 has such a shape that, as illustrated in FIG. 4, a width of an upper surface (51*a*) of a conductor layer 51 is smaller than a width of a lower surface (51*b*) of the conductor layer 51. Here, an inter-wiring distance between adjacent conductor layers 51 is determined based on the widths of the lower surfaces (51*b*) such that the lower surfaces (51*b*) are not in contact with each other. Therefore, it may be possible that an inter-wiring distance defined based on the widths of the upper surfaces (51*a*) cannot be reduced, and thus, it is not suitable for high-density wiring patterns.

A wiring substrate according to an embodiment of the present invention includes at least a structure that includes a substrate and a conductor layer, the conductor layer being formed of copper and being patterned and formed on the substrate. The conductor layer has a shape with a width of an upper surface thereof being equal to or larger than a width of a lower surface thereof and the width of the lower surface being larger than a minimum width of a middle portion.

A method for manufacturing a wiring substrate according to an embodiment of the present invention is a method for manufacturing a wiring substrate that includes at least a structure including a substrate and a conductor layer, the conductor layer being formed of copper and being patterned and formed on the substrate. The method includes: preparing the substrate; forming a copper plating film on an entire surface of the substrate; forming a dry film resist layer on the copper plating film according to a wiring pattern; forming a conductor layer with a width of an upper surface thereof being equal to or larger than a width of a lower surface thereof by removing a portion of the copper plating film where the dry film resist layer is not present by etching; and removing the dry film resist layer on the conductor layer.

Obviously, numerous modifications and variations of the present invention are possible in light of the above teachings. It is therefore to be understood that within the scope of the appended claims, the invention may be practiced otherwise than as specifically described herein.

The invention claimed is:

1. A wiring substrate, comprising:

a substrate; and a plurality of high-density wiring patterns formed on the substrate and comprising copper such that the high-density wiring patterns have upper surfaces that are not in contact with each other and that adjacent high-density wiring patterns have an inter-wiring distance determined based on widths of the upper surfaces of the adjacent high-density wiring patterns, wherein the plurality of high-density wiring patterns is formed such that the upper surface of each of the high-density wiring patterns has a width that is larger than a width of a lower surface of each of the high-density wiring patterns, that a ratio, the width of the upper surface/the width of the lower surface, is smaller than 1.15 and that the width of the lower surface is larger than a minimum width of a middle portion of each of the high-density wiring patterns between the upper surface and the lower surface.

2. The wiring substrate according to claim 1, wherein a ratio, the width of the upper surface/the minimum width of the middle portion, is larger than 1.15.

3. The wiring substrate according to claim 1, wherein a ratio, the width of the upper surface/the minimum width of the middle portion, is in a range of larger than 1.15 to smaller than 1.75.

4. The wiring substrate according to claim 1, wherein the plurality of high-density wiring patterns is formed by a process comprising etching a copper plating film formed on the substrate with a copper chloride etching solution comprising an etching inhibitor.

5. The wiring substrate according to claim 2, wherein a ratio, the width of the upper surface/the minimum width of the middle portion, is in a range of larger than 1.15 to smaller than 1.75.

6. The wiring substrate according to claim 2, wherein the plurality of high-density wiring patterns is formed by a process comprising etching a copper plating film formed on the substrate with a copper chloride etching solution comprising an etching inhibitor.

7. The wiring substrate according to claim 3, wherein the plurality of high-density wiring patterns is formed by a process comprising etching a copper plating film formed on the substrate with a copper chloride etching solution comprising an etching inhibitor.

8. The wiring substrate according to claim 5, wherein the plurality of high-density wiring patterns is formed by a process comprising etching a copper plating film formed on the substrate with a copper chloride etching solution comprising an etching inhibitor.

9. The wiring substrate according to claim 1, wherein the plurality of high-density wiring patterns is made of copper.

10. The wiring substrate according to claim 9, wherein a ratio, the width of the upper surface/the minimum width of the middle portion, is larger than 1.15.

11. The wiring substrate according to claim 9, wherein the ratio, the width of the upper surface/the minimum width of the middle portion, is in a range of larger than 1.15 to smaller than 1.75.

12. The wiring substrate according to claim 9, wherein the plurality of high-density wiring patterns is formed by a process comprising etching a copper plating film formed on the substrate with a copper chloride etching solution comprising an etching inhibitor.

13. The wiring substrate according to claim 1, wherein the substrate is a core substrate.

14. The wiring substrate according to claim 1, wherein the substrate is an insulating layer.

15. The wiring substrate according to claim 1, wherein a ratio, the width of the upper surface/the minimum width of the middle portion, is smaller than 1.75.

16. The wiring substrate according to claim 1, wherein the plurality of high-density wiring patterns is an etched copper plating film formed on the substrate.

* * * * *